(12) United States Patent
Harikrishna Mohan et al.

(10) Patent No.: US 11,997,866 B2
(45) Date of Patent: May 28, 2024

(54) HERMETICALLY SEALED ISOLATED OLED PIXELS

(71) Applicant: Universal Display Corporation, Ewing, NJ (US)

(72) Inventors: Siddharth Harikrishna Mohan, Plainsboro, NJ (US); William E. Quinn, Whitehouse Station, NJ (US); Ruiqing Ma, Morristown, NJ (US); Emory Krall, Philadelphia, PA (US); Luke Walski, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 722 days.

(21) Appl. No.: 17/136,404

(22) Filed: Dec. 29, 2020

(65) Prior Publication Data
US 2021/0119175 A1  Apr. 22, 2021

Related U.S. Application Data

(62) Division of application No. 14/661,335, filed on Mar. 18, 2015, now Pat. No. 10,910,590.

(Continued)

(51) Int. Cl.
*H10K 50/842* (2023.01)
*H10K 50/11* (2023.01)
(Continued)

(52) U.S. Cl.
CPC ......... *H10K 50/8426* (2023.02); *H10K 50/11* (2023.02); *H10K 50/81* (2023.02);
(Continued)

(58) Field of Classification Search
CPC .... H10K 50/8426; H10K 50/11; H10K 50/81; H10K 50/82; H10K 50/822;
(Continued)

(56) References Cited

U.S. PATENT DOCUMENTS

| 4,769,292 A | 9/1988 | Tang |
| 5,247,190 A | 9/1993 | Friend |

(Continued)

FOREIGN PATENT DOCUMENTS

| JP | 2005115362 | 4/2005 |
| JP | 2006260950 | 9/2006 |

(Continued)

OTHER PUBLICATIONS

Japanese Office Action (with English language translation) for App. No. JP2020-114590, dated Nov. 16, 2021, 18 pages.

(Continued)

*Primary Examiner* — Jonathan Han
(74) *Attorney, Agent, or Firm* — Butzel Long

(57) ABSTRACT

A novel thin film encapsulated OLED panel architecture and a method for making the panels with improved shelf life is disclosed. The OLED panel consists of a plurality of OLED pixels; each OLED pixel is individually hermetically sealed and isolated from its neighboring pixels. The organic stack of the OLED pixel is contained within its own hermetically sealed structure, achieved by making the structure on a barrier coated substrate and using a first barrier material as the grid and a second barrier for encapsulating the entire OLED pixel. The first barrier material provides the edge seal while the second barrier disposed over the pixel provides protection from top down moisture diffusion. By isolating and hermetically sealing individual pixels; any damage such as moisture and oxygen ingress due to defects or particles, delamination, cracking etc. can be effectively contained within the pixel thereby protecting other pixels in the panel.

11 Claims, 12 Drawing Sheets

Related U.S. Application Data

(60) Provisional application No. 61/970,937, filed on Mar. 27, 2014.

(51) Int. Cl.

| | | |
|---|---|---|
| *H10K 50/81* | (2023.01) | |
| *H10K 50/82* | (2023.01) | |
| *H10K 50/822* | (2023.01) | |
| *H10K 50/844* | (2023.01) | |
| *H10K 59/121* | (2023.01) | |
| *H10K 59/122* | (2023.01) | |
| *H10K 59/124* | (2023.01) | |
| *H10K 71/00* | (2023.01) | |
| *H10K 77/10* | (2023.01) | |
| *H10K 102/00* | (2023.01) | |
| H10K 50/813 | (2023.01) | |

(52) U.S. Cl.
CPC ........... *H10K 50/82* (2023.02); *H10K 50/822* (2023.02); *H10K 50/844* (2023.02); *H10K 59/121* (2023.02); *H10K 59/122* (2023.02); *H10K 59/124* (2023.02); *H10K 71/00* (2023.02); *H10K 77/111* (2023.02); H10K 50/813 (2023.02); H10K 2102/311 (2023.02)

(58) Field of Classification Search
CPC .. H10K 50/844; H10K 59/121; H10K 59/122; H10K 59/124; H10K 71/00; H10K 77/111; H10K 50/813; H10K 2102/311; Y02E 10/549
See application file for complete search history.

(56) References Cited

U.S. PATENT DOCUMENTS

| | | | |
|---|---|---|---|
| 5,368,904 A | 11/1994 | Stephinson | |
| 5,703,436 A | 12/1997 | Forrest | |
| 5,707,745 A | 1/1998 | Forrest | |
| 5,834,893 A | 11/1998 | Bulovic | |
| 5,844,363 A | 12/1998 | Gu | |
| 6,013,982 A | 1/2000 | Thompson | |
| 6,087,196 A | 7/2000 | Sturm | |
| 6,091,195 A | 7/2000 | Forrest | |
| 6,097,147 A | 8/2000 | Baldo | |
| 6,294,398 B1 | 9/2001 | Kim | |
| 6,303,238 B1 | 10/2001 | Thompson | |
| 6,337,102 B1 | 1/2002 | Forrest | |
| 6,468,819 B1 | 10/2002 | Kim | |
| 6,548,912 B1* | 4/2003 | Graff | H10K 50/844 |
| | | | 257/787 |
| 6,952,079 B2 | 10/2005 | Shiang | |
| 6,984,934 B2 | 1/2006 | Moller | |
| 7,015,640 B2 | 3/2006 | Schaepkens | |
| 7,198,332 B2 | 4/2007 | Kargl | |
| 7,279,704 B2 | 10/2007 | Walters | |
| 7,431,968 B1 | 10/2008 | Shtein | |
| 7,678,423 B2 | 3/2010 | Forrest | |
| 7,968,146 B2 | 6/2011 | Wagner | |
| 8,125,138 B2 | 2/2012 | Luttgens | |
| 8,179,029 B2 | 5/2012 | Boerner | |
| 8,277,916 B2 | 10/2012 | Cockman | |
| 8,432,095 B2 | 4/2013 | Pang | |
| 2003/0230980 A1 | 12/2003 | Forrest | |
| 2004/0046497 A1 | 3/2004 | Schaepkens | |
| 2004/0174116 A1 | 9/2004 | Lu | |
| 2004/0218127 A1* | 11/2004 | Miura | G02F 1/1333 |
| | | | 349/122 |
| 2005/0046341 A1 | 3/2005 | Keda | |
| 2005/0082966 A1 | 4/2005 | Yamazaki | |
| 2005/0191448 A1 | 9/2005 | Suh | |
| 2006/0187213 A1 | 8/2006 | Su | |
| 2007/0108890 A1 | 5/2007 | Forrest | |
| 2007/0114519 A1 | 5/2007 | Hayashi | |
| 2007/0159094 A1 | 7/2007 | Ph | |
| 2007/0181872 A1 | 8/2007 | Lee | |
| 2007/0252525 A1* | 11/2007 | Seki | H10K 59/122 |
| | | | 313/509 |
| 2007/0269621 A1 | 11/2007 | Mitsuhashi | |
| 2008/0006819 A1 | 1/2008 | McCormick | |
| 2008/0129189 A1 | 6/2008 | Cok | |
| 2008/0211402 A1 | 9/2008 | Decook | |
| 2009/0039773 A1 | 2/2009 | Jun | |
| 2009/0267764 A1 | 10/2009 | Klaas | |
| 2010/0143785 A1 | 6/2010 | Kwag | |
| 2010/0201256 A1 | 8/2010 | Kue | |
| 2010/0258821 A1 | 10/2010 | Forrest | |
| 2011/0032704 A1 | 2/2011 | Oh | |
| 2011/0157540 A1 | 6/2011 | Jung | |
| 2011/0164047 A1 | 7/2011 | Pance | |
| 2011/0198597 A1* | 8/2011 | Antonenkov | H10K 50/824 |
| | | | 438/34 |
| 2012/0007791 A1 | 1/2012 | Grbic | |
| 2012/0161610 A1 | 6/2012 | Levermore | |
| 2012/0181933 A1 | 7/2012 | Ma | |
| 2012/0205698 A1 | 8/2012 | Yamazaki | |
| 2013/0153915 A1 | 6/2013 | Choi | |
| 2013/0223016 A1 | 8/2013 | Kim | |
| 2013/0242399 A1 | 9/2013 | Tsuboi | |
| 2013/0248867 A1* | 9/2013 | Kim | H10K 50/844 |
| | | | 438/34 |
| 2014/0003072 A1 | 1/2014 | Yamamoto | |
| 2014/0077188 A1 | 3/2014 | Aonuma | |
| 2014/0300830 A1 | 10/2014 | Wang | |
| 2014/0346535 A1 | 11/2014 | Son | |
| 2014/0353625 A1 | 12/2014 | Yi | |
| 2014/0374704 A1 | 12/2014 | Jang | |
| 2015/0034916 A1 | 2/2015 | Lee | |
| 2015/0064858 A1 | 3/2015 | Choi | |
| 2015/0137097 A1 | 5/2015 | Choi | |
| 2015/0200315 A1 | 7/2015 | Mukai | |
| 2015/0284989 A1 | 10/2015 | Kim | |
| 2016/0121583 A1 | 5/2016 | Edwards | |

FOREIGN PATENT DOCUMENTS

| | | |
|---|---|---|
| JP | 2007227288 | 9/2007 |
| JP | 2007234431 | 9/2007 |
| JP | 2009032464 A | 2/2009 |
| JP | 2010086704 | 4/2010 |
| JP | 2011151017 A | 8/2011 |
| JP | 2011222246 A | 11/2011 |
| JP | 201294429 A | 5/2012 |
| JP | 2013030467 A | 2/2013 |
| JP | 2013198158 | 9/2013 |
| JP | 2013206845 A | 10/2013 |
| JP | 201565025 | 4/2015 |
| KR | 20070054106 A | 5/2007 |
| KR | 20130067668 A | 6/2013 |
| TW | 271697 | 1/2007 |
| TW | 277023 B | 3/2007 |
| WO | 2008057394 A1 | 5/2008 |
| WO | 2010011390 A2 | 1/2010 |
| WO | 2013180544 | 12/2013 |
| WO | 2014038158 | 3/2014 |

OTHER PUBLICATIONS

EESR for EP 15161233.0, mailed Oct. 19, 2015.
"Mechanical Properties of Tempered Glass", Table of Values, http://www.precisionglass.com/tech/gp.pdf.
Gunnarrsson, et al., "Deformation and Failure of Polycarbonate during Impact as a Function of Thickness", Proceedings of the SEM Annual Conference Jun. 1-4, 2009, Albuquerque, New Mexico, USA, 2009 Society for Experimental Mechanics Inc.
Lewis, et al., "Thin-Film Permeation-Barrier Technology for Flexible Organic Light-Emitting Devices", IEEE Journal of Selected Topics in Quantum Electronics, vol. 10, No. 1, Jan./Feb. 2004, pp. 45-57.
Korean Office Action (with English translation) for App. No. KR10-2015-0043070, dated May 28, 2021, 15 pages.

(56) References Cited

OTHER PUBLICATIONS

Baldo et al.Highly efficient phosphorescent emission from organic electroluminescent devices, Nature, vol. 395, pp. 151-154, 1998.
Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.
Bulovic, et al., "Weak microcavity effects in organic light-emitting devices", The American Physical Society, Physical Review B, vol. 58, No. 7, Aug. 15, 1998, pp. 3730-3740.
D'Andrade, et al., "Organic light-emitting device luminaire for illumination applications", Applied Physics Letters 88, 192908, 2006, http://dx.doi.Org/10.1063/1.2202722, 4 pages.
Reineke, et al., "White organic light-emitting diodes with fluorescent tube efficiency", Nature, Letters, vol. 459, May 14, 2009, doi:10.1038/nature08003, pp. 234-239.
CN Office Action for CN201510142861.8 dated May 4, 2018, 7 pages.
Chinese Office Action issued in corresponding CN Patent Application No. 104109832, dated Jul. 26, 2018, 12 pages.
JP Notice of Reasons for Rejection for JP 2015-063628, dated Sep. 18, 2018, 16 pages.
ArmorCore, UL 752 Specifications and Ammunition. Accessed on Dec. 21, 2018 via The Wayback Machine (Jun. 26, 2011) at https://web.archive.org/web/20110626221047/http://www.arnnorcore.conn/docs/UL 752 Specification.pdf (Year: 2011).
Japanese Office Action (with English language translation) for Application No. 2015-063628, dated Jun. 25, 2019, 18 pages.
Taiwanese Office Action (with English language translation) for Application No. 104109832, dated May 28, 2019, 11 pages.
Japanese Office Action (with English language translation) for Application No. JP2015-063628, dated Mar. 24, 2020, 5 pages.
Japanese Pre-Appeal (with English language translation) for App. No. JP2015-063628, dated Sep. 10, 2020, 4 pages.
Office Action dated Mar. 12, 2018 for U.S. Appl. No. 14/661,335 (pp. 1-15).
Korean Office Action (with English translation) for App. No. KR10-2015-0043070, dated Aug. 31, 2020, 15 pages.
European Patent Office Communication Pursuant to Article 94(3) EPC for App. No. EP15161233.0, dated Nov. 24, 2020, 8 pages.

\* cited by examiner

HERMETICALLY SEALED ISOLATED OLED PIXELS

CROSS-REFERENCE TO RELATED APPLICATIONS

This application claims the benefit under 35 U.S.C. 119(e) of a U.S. provisional patent application of Siddharth Harikrishna Mohan et al., entitled "Hermetically Sealed Isolated OLED Pixels", Ser. No. 61/970,937, filed Mar. 27, 2014, the entire contents of said application being incorporated herein by reference.

JOINT RESEARCH

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on or before the effective filing date of the claimed invention, and the claimed invention was made as a result of activities undertaken within the scope of the agreement.

FIELD OF THE INVENTION

The present invention relates generally to the fabrication of high efficiency OLED devices and more specifically, to the fabrication of OLED panels wherein each OLED pixel of the panel is individually hermetically sealed and isolated from its neighboring pixels.

BACKGROUND

Organic light-emitting diode (OLED) displays and lighting panels need reliable protection from atmospheric gases, in particular moisture and oxygen. Conventionally protection is provided by encapsulating the OLEDs and a desiccant between two glass plates, which are sealed around the edge with an adhesive. This traditional encapsulation method makes the display rigid and hence cannot be used for encapsulating flexible OLEDs. To make OLED displays and lighting panels flexible and lightweight, thin film encapsulation must be used instead of rigid glass plates. Flexible OLED display and lighting panels fabricated on polymeric substrates such as poly ethylene terephthalate (PET) and poly ethylene naphthalate (PEN), require moisture protection on both the top side and bottom side of the device as the substrates have poor moisture barrier properties. For example, the water vapor transmission rate (WVTR) of 100 um thick PET is approximately 3.9 and 17 g/m$^2$/day at 37.8 C. and 40 C. respectively. The most widely quoted value for required water vapor transmission rate (WVTR) for an OLED lifetime of 10000 h is $10^{-6}$ g/m$^2$/day. Similarly, required oxygen transmission rate (OTR) for similar lifetimes has been reported as anywhere from to $10^{-5}$ cm$^3$/m$^2$/day to $10^{-3}$ cm$^3$/m$^2$/day (Lewis and Weaver).

Thin film encapsulation has been demonstrated for encapsulating substrates and electronics devices. U.S. Pat. No. 6,548,912 B1 teaches the use of 'multiple' barrier stacks/dyads to encapsulate moisture sensitive devices (such as OLEDs) and substrates. Each barrier stack or "dyad" consists of an inorganic material/polymer layer pair. U.S. Pat. No. 7,015,640 B2 discloses the use of a graded composition diffusion barrier to encapsulate OLEDs and substrates. In this method, multiple alternate layers of SiO$_x$N$_y$/SiO$_x$C$_y$ are deposited at room temperature by PECVD. A single hybrid barrier layer can be grown by plasma enhanced chemical vapor deposition (PECVD) of an organic precursor with a reactive gas such as oxygen, e.g., HMDDSO/O$_2$. The barrier coating process is described in U.S. Pat. No. 7,968,146 B2. The barrier film is highly impermeable yet flexible. This material is a hybrid of inorganic SiO$_2$ and polymeric silicone that is deposited at room temperature. The barrier film has permeation and optical properties of glass, but with a partial polymer character that gives a thin barrier film a low permeability and flexibility.

A typical thin film encapsulated OLED panel on a rigid substrate such as glass or metal foil is shown in FIG. 1. The panel 10 of FIG. 1 consists of a first electrode (anode) 11, insulating grid 12, an organic stack 13 and a second electrode (cathode) 14 between a substrate 15 and a thin film barrier 16. The anode 12 is typically a transparent conductive oxide having a high work function such as indium tin-oxide (ITO) or indium zinc oxide (IZO). The sheet resistance is typically in the range of 10-100 Ohm/square for a thickness range of 50-200 nm. This is in contrast to metal with a sheet resistance <1 Ohm/square, which is often used for the reflective cathode. High sheet resistance of the anode can result in brightness non-uniformity, which becomes more evident when scaling to large-area light panels. In order to improve uniformity, highly-conductive metal bus lines may be deposited in electrical contact with the TCO electrode to provide improved current distribution across the panel 20 as shown in FIG. 2. The panel 20 of FIG. 2 consists of a first electrode (anode) 21, insulating grid 22, an organic stack 23 and a second electrode (cathode) 24 between a substrate 25 and a thin film barrier 26. The insulating grid 22 is usually disposed over a portion of the first electrode (anode) 21, as shown in FIG. 1 to define the active area. Additionally, insulating grid layer 22 is required to cover the bus lines 27 to prevent electrical shorting occurring between the bus lines 27 and the second electrode (cathode) 24. Polymer materials such as polyimide and inorganic insulating materials such as SiO$_2$ or Si$_3$N$_4$ are conventionally used as grids in active and passive matrix organic light emitting diode devices. The conventional way to pattern metal bus tines is through photolithography. In some device architectures, organic materials evaporated through a conventional shadow mask have also been used as insulating grids. The organic stack is comprised of several layers including a hole injecting layer (HIL), hole transporting layer (HTL), emissive layer (EML), blocking layer (BL), and electron injecting layer (EIL). The organic layers are usually deposited by conventional vacuum thermal evaporation (VTE) method. Typically the emissive layers are patterned using a shadow mask to obtain RGB sub-pixels, while the transport layers are "blanket" deposited. In other device architectures such as micro cavity OLEDs, one or more injection/transport layers may be patterned to obtain maximum efficiency. During blanket deposition, organic material gets deposited on top and the sidewalk (depending upon the shape of the grid) of the insulating grid. The cathode is subsequently deposited on the organic stack to complete the device. Barrier films are deposited on top to hermetically seal the OLED panel.

A typical thin film encapsulated OLED panel on a flexible polymer substrate such as poly ethylene terephthalate (PET) and poly ethylene naphthalate (PEN) is shown in FIGS. 3 and 4. The panel structure is similar to a rigid substrate except for the addition of thin film barrier either on the top side of the substrate (prior to anode) or the bottom side of the substrate. These thin film barriers are required on the substrate side of the panel to protect the device from moisture.

In the architecture shown in FIG. 3, the barrier 37 is disposed on the back side of the substrate 35. The panel 30 of FIG. 3 consists of a first electrode (anode) 31, insulating grid 32, an organic stack 33 and a second electrode (cathode) 34 between a substrate 35 and a thin film barrier 36. The barrier 37 is disposed on the back side of the substrate 35. In FIG. 4, the panel 40 consists of a first electrode (anode) 41, insulating grid 42, an organic stack 43 and a second electrode (cathode) 44 between a substrate 45 and a thin film barrier 46. The barrier 47 is disposed on top of the substrate 45 before the anode 41.

Although, the above (current technology) thin film encapsulated OLED device architectures shown in FIGS. 1-4 have been demonstrated, these panels are not robust against any "damages". "Damages" may include defects/particles, pin holes, delamination/cracks induced during flexing or cutting the panel etc. For example, if a defect or a particle embedded in the pixel or the polymer grid penetrates the thin film barrier deposited on top of the device, moisture from the atmosphere will spread across the panel as both organic and polymer materials are highly permeable to moisture. This would eventually lead to dark spots and a dead panel. In addition, insulating grids made from polymer materials such as polyimide can be a reservoir of moisture themselves and may damage the OLED devices when the moisture contained within the polymer is released. If the polymer material is replaced by a low permeability material, it would not release any moisture and would prevent transfer of moisture from one pixel to other. Inorganic materials such as $SiO_2$ and $Si_3N_4$ have been used for this application. Although inorganic grids are effective, it is difficult to process them at low temperatures especially on flexible polymeric substrates. In most cases, these layers are very brittle and crack when flexed. Within the OLED device structure, it is well known that the adhesion strength at the organic and cathode interface is weak. This interface is susceptible to delamination especially when a highly compressive barrier film is deposited over the cathode. Further, since the organic stack is blanket deposited (continuous), any local delamination/crack occurring at a weak spot in a pixel can propagate across the entire panel, especially after flexing. Similarly, damages can be induced during the cutting/shaping process of a panel, including: a) electrical short; b) delamination of the cathode and the barrier from the organic (adhesion strength of cathode to organic is very weak); and c) delamination combined with crack propagation when the panel is flexed. Additionally, a cut panel leaves exposed edges on the side that was cut. Exposed edges of organic and/or the polymer grid have no protection from moisture leading to a catastrophic failure of the panel. For example if the panel shown in FIG. 3 is cut along AA'; i.e.: cutting through top barrier, cathode, organic, anode, substrate, and bottom thin film barrier, the entire panel is physically damaged and does not light up. Delamination or cracks induced by the cutting process tends to propagate across the entire panel; since the weak organic-cathode interface is continuous across the panel leading to a catastrophic failure.

To realize a long lasting panel, reliable means of preventing damage propagation and water penetration is needed after cutting. In other words, isolated hermetically sealed pixels are needed. Isolated hermetically sealed pixels can be realized by using one or more of a:
1) Barrier grid: A flexible material with good barrier property for a grid, especially for flexible display and electronic applications. This should be processed at low temperature; and
2) Isolated or panic stack: The organic stack needs to be patterned and not continuous across the pixels. This will prevent delamination/crack propagation as organic-cathode regions are eliminated.

BRIEF SUMMARY

According to embodiments of the disclosed subject matter, a system and method is provided to substantially address the problems associated with the prior art and provide for the fabrication of high efficiency OLED devices and more specifically, to the fabrication of OLED panels wherein each OLED pixel of the panel is individually hermetically sealed and isolated from its neighboring pixels.

Some embodiments of the disclosed subject matter disclose a novel thin film encapsulated OLED panel architecture and a method for making the panels with improved shelf life. The OLED panel consists of a plurality of OLED pixels; each OLED pixel is individually hermetically sealed and isolated from its neighboring pixels. More specifically, the organic stack of the OLED pixel is contained within its own hermetically sealed structure. Hermetic sealing is achieved by making the structure on a barrier coated substrate and using a first barrier material as the grid and a second barrier for encapsulating the entire OLED pixel. The first barrier material provides the edge seal while the second barrier disposed over the pixel provides adequate protection from top down moisture diffusion. By isolating and hermetically sealing individual pixels, any damage such as moisture and oxygen ingress due to defects or particles, delamination, cracking etc. can be effectively contained within the pixel thereby protecting the other pixels in the panel. Thus, a long lasting OLED lighting panel can be manufactured.

Some embodiments of the disclosed subject matter also disclose a method for making the OLED device. The focus is on choosing the barrier materials and processes for especially making the barrier grid and isolating the organic stack. Finally, some embodiments of the disclosed subject matter when experimentally tested, demonstrate the concept of hermetic sealing and an OLED device after cutting.

Although many embodiments are described above as comprising different features and/or combination of features, a person of ordinary skill in the art after reading this disclosure may understand that in some instances, one or more of these components could be combined with any of the components or features described above. That is, one or more features from any embodiment can be combined with one or more features of any other embodiment without departing from the scope of the invention. As noted previously, all measurements, dimensions, and materials provided herein within the specification or within the figures are by way of example only.

BRIEF DESCRIPTION OF THE FIGURES

The accompanying drawings, which are incorporated herein and form a part of the specification, illustrate embodiments of the present invention and, together with the description, further serve to explain the principles of the invention and to enable a person skilled in the pertinent art to make and use the invention.

DETAILED DESCRIPTION OF THE INVENTION

Figure 1:
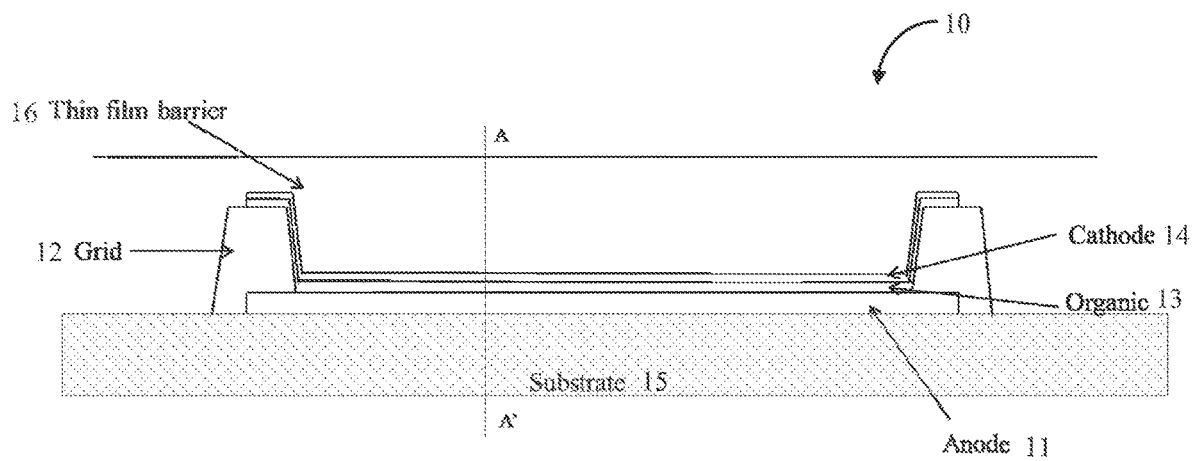
FIG. 1 shows a cross section of a thin film encapsulated OLED panel on a rigid substrate.
Figure 2:
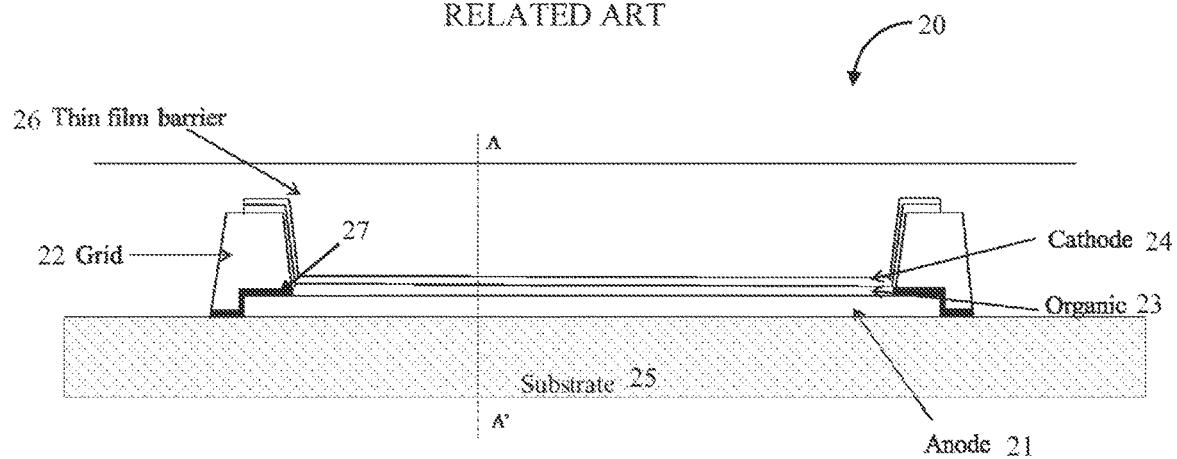
FIG. 2 shows a cross section of a thin film encapsulated OLED panel on a rigid substrate. Metal bus lines are included.
Figure 3:
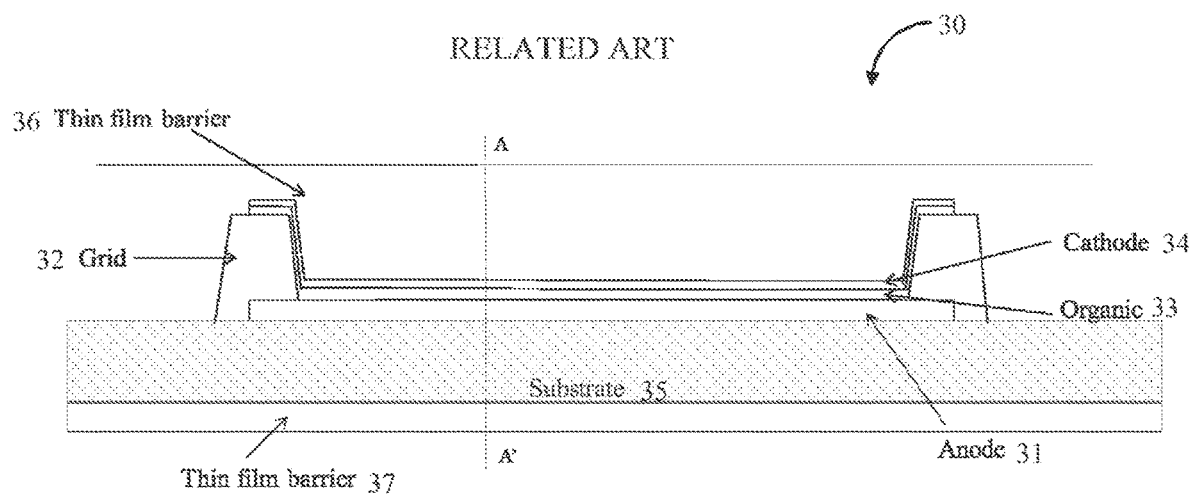
FIG. 3 shows a cross section of a thin film encapsulated OLED panel on a flexible polymer substrate such as poly ethylene terephthalate (PET) and poly ethylene naphthalate (PEN). A thin film barrier is disposed on the back side of the substrate.
Figure 4:
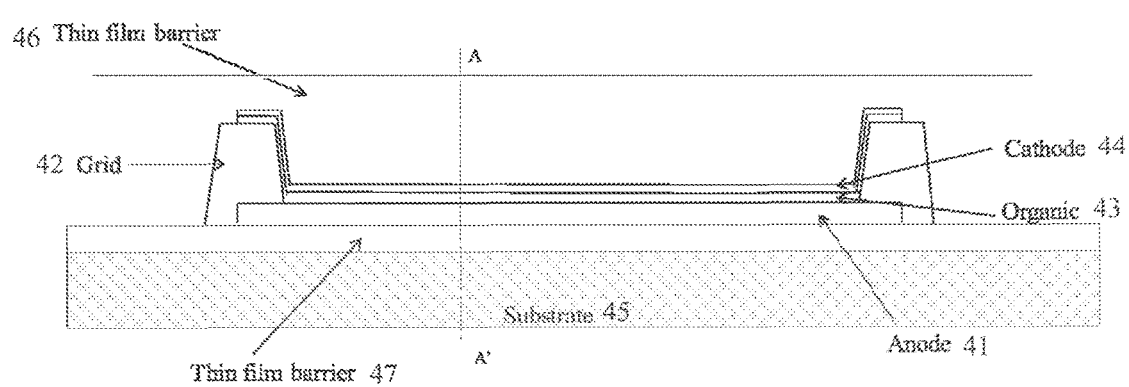
FIG. 4 shows a cross section of a thin film encapsulated OLED panel on a flexible polymer substrate such as poly ethylene terephthalate (PET) and poly ethylene naphthalate (PEN). The thin film barrier is disposed on top of the substrate before the anode.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "excitors," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Examples include Baldo et al., "Highly Efficient Phosphorescent Emission from Organic Electroluminescent Devices," Nature, Vol. 395, 151-154, 1998; ("Baldo-I") and Baldo et al., "Very high-efficiency green organic light-emitting devices based on electro phosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6. More details on OLEDs, and the definitions described above, can be found in U.S. Pat. No. 7,279,704, the entire content of which is incorporated herein by reference.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

In embodiments of the current invention, a novel thin film encapsulated MED panel architecture and a method for making the panels with improved shelf life is disclosed. The OLED panel consists of a plurality of OLED pixels; each OLED pixel is individually hermetically sealed and isolated from its neighboring pixels. More specifically, the organic stack of the OLED pixel is contained within its own hermetically sealed structure. Hermetic sealing is achieved by making the structure on a barrier coated substrate and using a first barrier material as the grid and a second barrier for encapsulating the entire OLED pixel. The first barrier material provides the edge seal while the second barrier disposed over the pixel provides adequate protection from top down moisture diffusion. By isolating and hermetically sealing individual pixels; any damage such as moisture and oxygen ingress due to defects or particles, delamination, cracking etc. can be effectively contained within the pixel thereby protecting the other pixels in the panel. The advantage of patterning the organic stack and cathode layout into pixels is to enable cutting tolerance, especially for flexible OLED panels. It is commonly known that when organic and cathode materials are exposed to ambient environment, the materials will degrade or delaminate. On the other hand, anode materials such as ITO or IZO, bus lines that use gold, and grids that use inorganic dielectric are stable in the air environment. Therefore, as long as organic and cathode materials are well protected from exposure to air, the device should retain its shelf lifetime. In order to maintain the lifetime of a thin film encapsulated panel during cutting, the organic and cathode layer of each pixel needs to be isolated from neighboring pixel cathode layers, so that the exposure to ambient environment (moisture, and oxygen) of one pixel will not propagate to the others. Therefore, if the panel is cut, only the pixels, or partial pixels of the cut edge, will degrade in air, but the rest of the panel will still be hermetically sealed.

Embodiment 1

Patterned Organic and Cathode Layer, and Blanket Barrier

Figure 5:
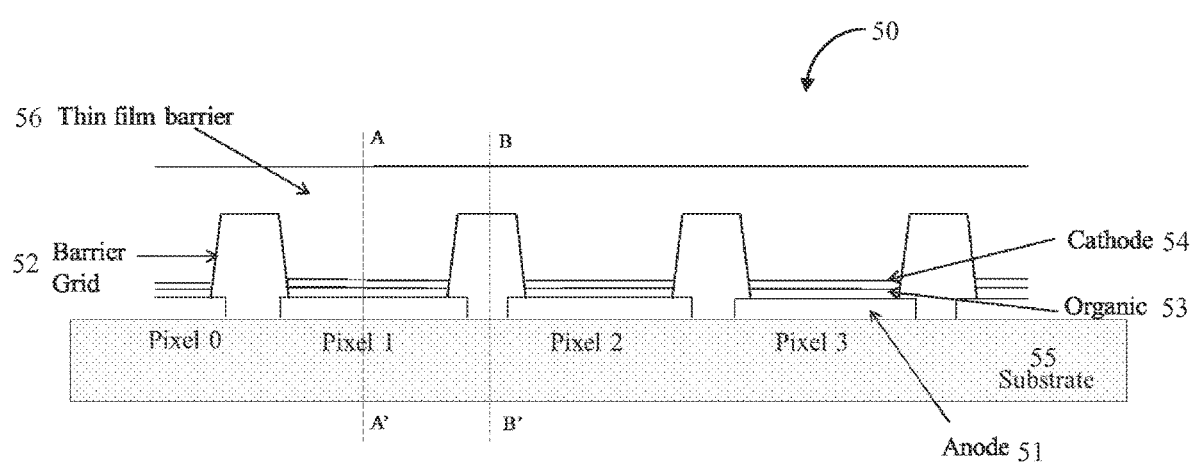
FIG. 5 shows a cross section of a thin film encapsulated OLED panel on a rigid substrate containing 4 pixels according to an embodiment of the disclosed subject matter. AA' and BB' are the cutting axis.
Figure 6:
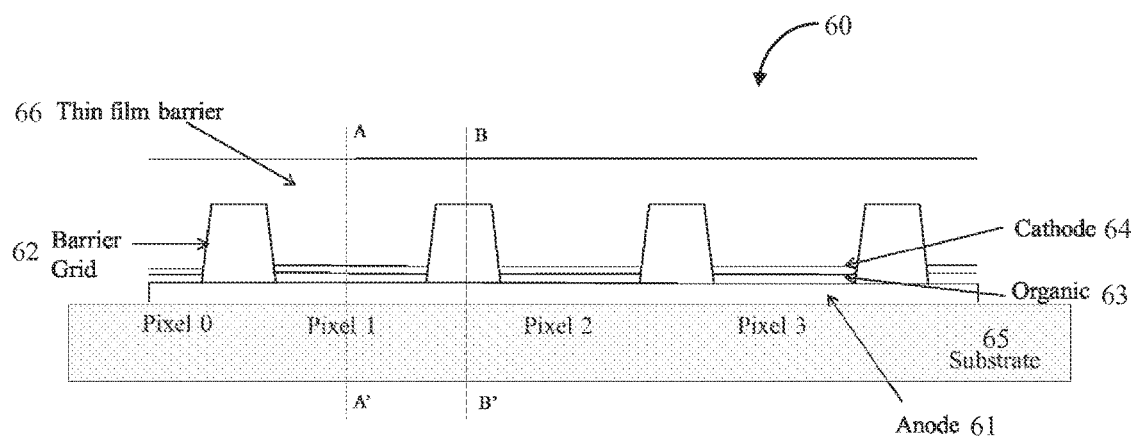
FIG. 6 shows a cross section of a thin film encapsulated OLED panel on a rigid substrate containing 4 pixels according to an embodiment of the disclosed subject matter. AA' and BB' are the cutting axis.
Figure 7:
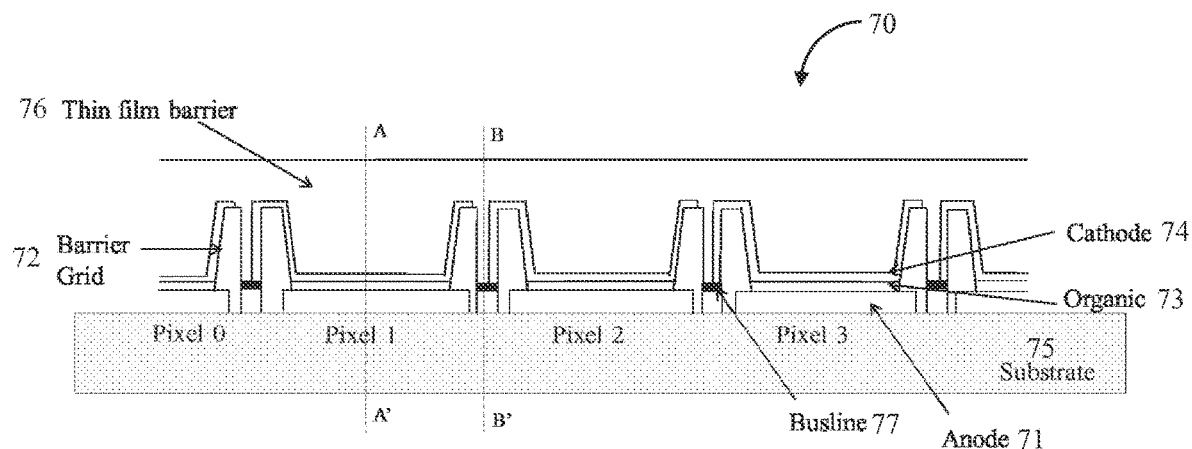
FIG. 7 shows a cross section of a thin film encapsulated OLED panel on a rigid substrate containing 4 pixels according to an embodiment of the disclosed subject matter. AA' and BB' are the cutting axis. The cathode is addressed through separate bus lines.

A cross section of one embodiment of the present invention is shown in FIG. 5. The panel 50 of FIG. 5 consists of a plurality of electrodes (anodes) 51, insulating grid 52, organic stacks 53 and second electrodes (cathodes) 54 between a substrate 55 and a thin film barrier 56. In this figure, a section of the OLED panel containing 3 pixels (Pixels 1, 2, 3) is shown. A lighting panel generally contains a plurality of these hermetically sealed pixels electrically connected to each other. The anode, organic stack and the cathode are patterned. FIG. 6 shows another variation of the current embodiment in which the anode is continuous (not patterned). The panel 60 of FIG. 6 consists of an electrode (anode) 61, insulating grid 62, organic stacks 63 and second electrodes (cathodes) 64 between a substrate 65 and a thin film barrier 66. The grid disposed over a portion of the anode is a barrier material. This barrier grid provides the required edge seal for the pixels. The organic stack is patterned in such a way that the organic material is not continuous over the entire panel. The top contact or cathode of the device will cover the organic layers and forms an electrical contact outside of the pixel footprint. This can be accomplished using vias that connect the cathode to a bus line as shown in FIG. 7, or by using a cathode material that is also an excellent barrier, such as metals or certain TCO materials, such as IZO. The panel 70 of FIG. 7 consists of a plurality of electrodes (anodes) 71, insulating grid 72, organic stacks 73 and second electrodes (cathodes) 74 between a substrate 75 and a thin film barrier 76. A plurality of bus lines 77 are provided between discontinuous grid portions. The entire panel is thin film encapsulated by one or more barrier materials. This barrier material will henceforth be addressed as "top barrier". The top barrier is continuous, i.e.: not patterned. In the illustrated example, the top barrier 76 is shown to be planarizing for simplicity. The top barrier may be planarizing or may be conformal. Thus, in each pixel, the top barrier material is in contact with the barrier grid material. The pixels are thus hermetically sealed and isolated.

Figure 8:
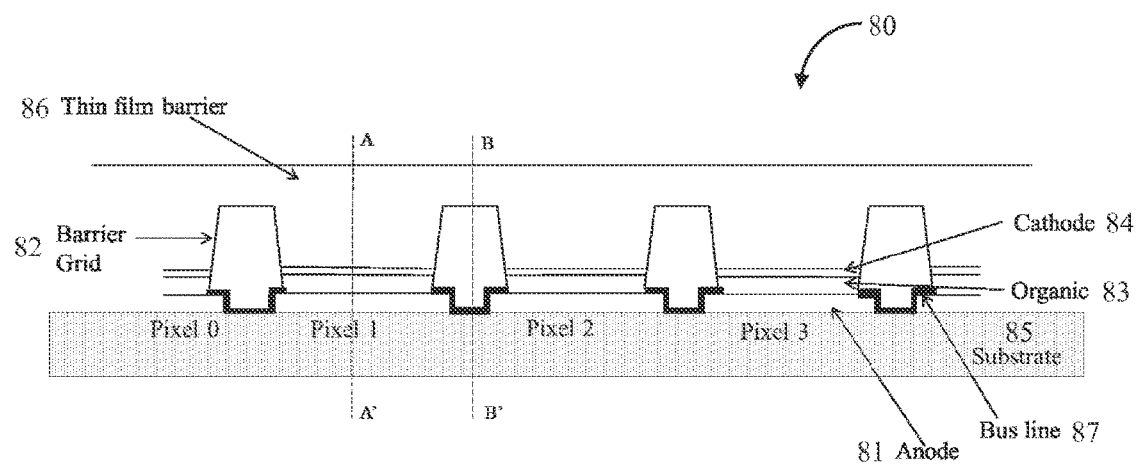
FIG. 8 shows a cross section of a thin film encapsulated OLED panel on a rigid substrate containing 4 pixels according to an embodiment of the disclosed subject matter. AA' and BB' are the cutting axis. Metal bus lines are included.
Figure 9:
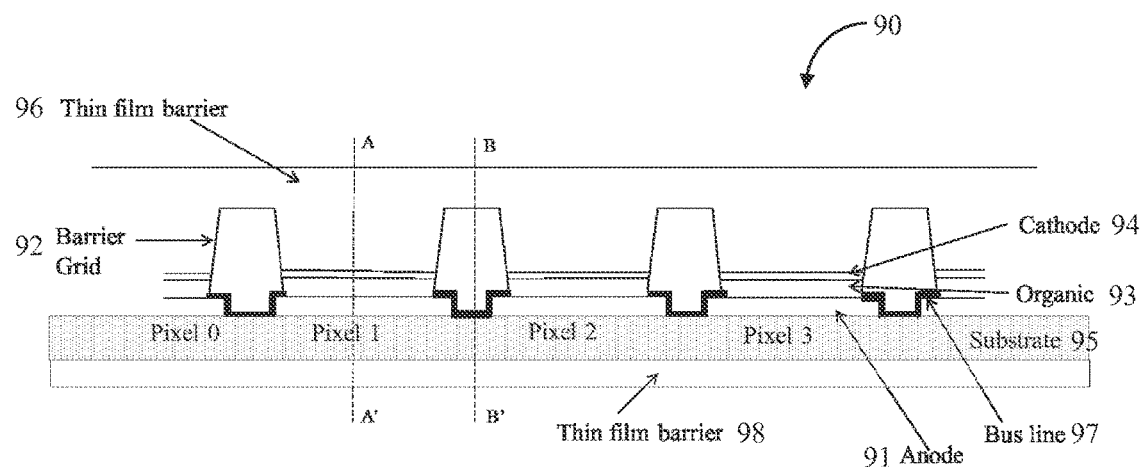
FIG. 9 shows a cross section of a thin film encapsulated OLED panel containing 4 pixels on a flexible polymer substrate such as poly ethylene terephthalate (PET) and poly ethylene naphthalate (PEN) according to an embodiment of the disclosed subject matter. A thin film barrier is disposed on the back side of the substrate. Metal bus lines are included.
Figure 10:
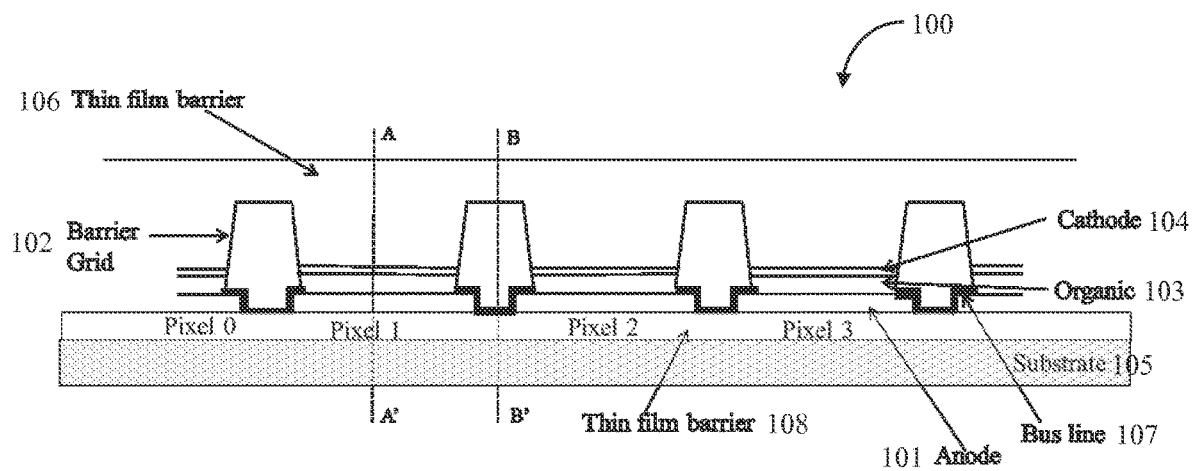
FIG. 10 shows a cross section of a thin film encapsulated OLED panel containing 4 pixels on a flexible polymer substrate such as poly ethylene terephthalate (PET) and poly ethylene naphthalate (PEN) according to an embodiment of the disclosed subject matter. The thin film barrier is disposed on top of the substrate before the anode. Metal bus lines are included.

Another variation of the current embodiment is shown in FIG. 8. The panel 80 of FIG. 8 consists of a plurality of electrodes (anodes) 81, insulating grid 82, organic stacks 83 and second electrodes (cathodes) 84 between a substrate 85 and a top barrier 86. A plurality of bus lines 87 are also provided. The device architecture is similar to FIG. 5 except for the addition of metal bus lines 87 to improve current distribution across the panel 80. The barrier grid 82 here is disposed over the bus lines 87 to prevent electrical shorting with the cathode 84. Additionally, for flexible lighting panels fabricated on polymeric substrates such as poly ethylene terephthalate (PET) and poly ethylene naphthalate (PEN), thin film barriers are required on the substrate side of the panel to protect the device from moisture. Examples are shown in FIGS. 9 and 10. In the architecture shown in FIG. 9, a thin film barrier is disposed on the back side of the substrate. The panel 90 of FIG. 9 consists of a plurality of electrodes (anodes) 91, insulating grid 92, organic stacks 93 and second electrodes (cathodes) 94 between a substrate 95 and a top barrier 96. A plurality of bus lines 97 are also provided. A thin film barrier 98 is disposed on the back side of the substrate 95. In the architecture shown in FIG. 10, the barrier is disposed on top of the substrate before the anode. The panel 100 of FIG. 10 consists of a plurality of electrodes (anodes) 101, insulating grid 102, organic stacks 103 and second electrodes (cathodes) 104 between a substrate 105 and a top barrier 106. A plurality of bus lines 107 are also provided. A thin film barrier 108 is disposed on top of the substrate 105 before the anodes 101.

A novel aspect of the invention is hermetic sealing of individual pixels which is achieved by using a barrier grid in conjunction with an isolated organic stack. More specifically, the organic stack of the OLED pixel is contained within its own hermetically sealed structure.

Barrier grid materials according to some embodiments of the invention are patterned to isolate each organic stack of an OLED pixel and can be transparent or opaque depending on the design and application of the device. Inorganic materials such as metal oxides, metal nitrides, metal oxynitrides, metal carbides, metal oxyborides and combinations thereof can be used as a barrier grid material. Although inorganic grids are effective for rigid substrates, it is difficult to process them at low temperatures especially on flexible polymeric substrates. Further, in most cases, these layers are very brittle and crack when flexed. An alternative is to use a hybrid barrier material such as $SiO_xC_yH_z$. Some organic content may be preferred to ensure that a thick layer can be made without cracking or delamination due to defects or internal stress. This organic content may also improve the flexibility of the film. One such example is the hybrid barrier layer taught in U.S. Pat. No. 7,968,146 B2. This material is a hybrid of inorganic $SiO_2$ and polymeric silicone. This barrier grid provides the required edge seal for the pixels. Patterning of barrier grid depends on the barrier material chosen. For example, if the hybrid material $SiO_xC_yH_z$ is chosen, patterning can be achieved by wet etching or dry etching. Dry retching methods include plasma etching, reactive ion etching (RIE), deep reactive ion etching (DRIE) etc.

Each organic stack of an OLED pixel is patterned and isolated by the barrier grid according to some embodiments of the invention, which takes into account the adhesion strength at the organic and cathode interface in an OLED is weak. This interface is susceptible to delamination especially when a highly compressive barrier film is deposited over the cathode. If the organic stack is blanket deposited (continuous), any local delamination occurring at a weak spot in a pixel can spread to other pixels. To avoid delamination/crack propagation, the organic stack is patterned in such a way that the organic material is not continuous across the entire panel. The organic stack is thus "isolated" from its neighboring pixel. The top barrier layer deposited over this structure is in contact with the grid material forming an isolated pixel. Any local delamination/crack occurring at a weak spot in a pixel is confined to that pixel and does not spread. Thus, in each pixel the top barrier material is in contact with the barrier grid material. The pixels are thus hermetically sealed and isolated.

Referring to FIGS. 5 through 10, if this panel is cut along AA'; i.e.: cutting through top barrier, cathode, organic, anode, substrate, and thin film barrier (if present), can damage the pixel in few ways: a) by introducing an electrical short; b) delamination of the cathode and the barrier from the organic; and c) delamination/crack propagation when the panel is flexed. Although Pixel 1 is compromised after the cutting process, Pixels 0, 2 and 3 stay intact. The delamination/cracks do not spread to Pixels 0, 2 and 3 as the organic stack is isolated. Further since the grid made from a barrier material, Pixels 0, 2 and 3 remain hermetically sealed.

If the panel is cut along BB'; i.e.: cutting through top barrier, barrier grid, substrate, and thin film barrier (if present), none of the pixels are damaged as this region does not have the weak organic-cathode interface. Additionally, the adhesion strength between the barrier grid and top barrier is very good. Pixels 0, 1, 2 and 3 should function since the electrical contact is intact. Delamination/cracks do not spread to Pixels 0, 1, 2 or 3 as the organic stack is isolated and remains hermetically sealed. In all the cases, the lifetime of the panel will be determined by the edge sealing ability of the barrier grid.

Embodiment 2

Patterned Organic, Cathode and Barrier

Figure 11:
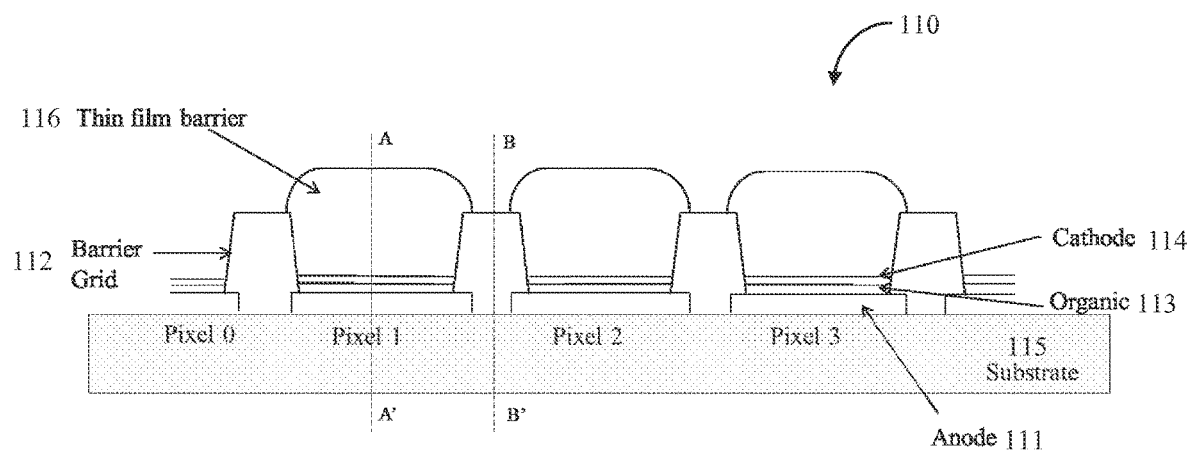
FIG. 11 shows a cross section of a thin film encapsulated OLED panel on a rigid substrate containing 4 pixels according to an embodiment of the disclosed subject matter. AA' and BB' are the cutting axis. The top thin film barrier is patterned.
Figure 12:
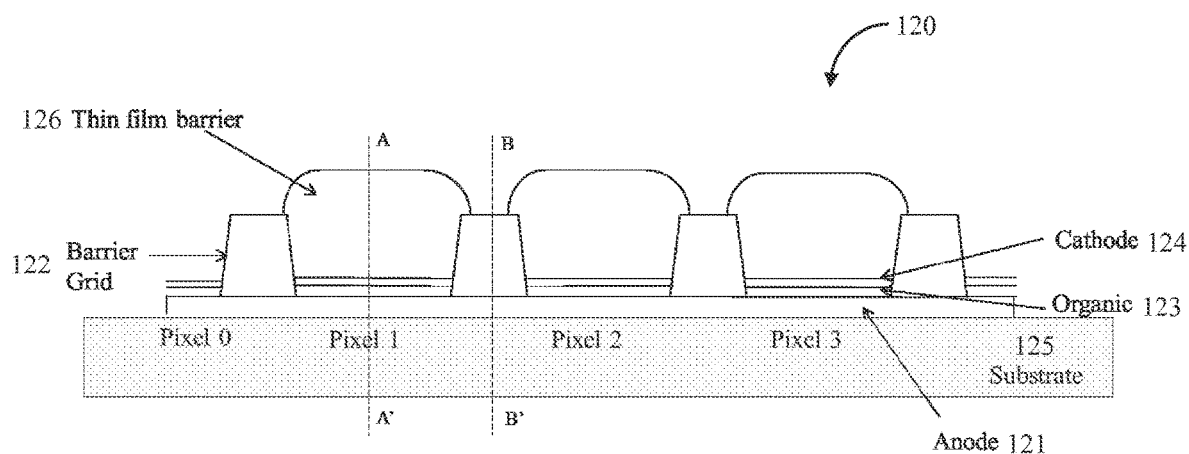
FIG. 12 shows a cross section of a thin film encapsulated OLED panel on a rigid substrate containing 4 pixels according to an embodiment of the disclosed subject matter. AA' and BB' are the cutting axis. The top thin film barrier is patterned.

In another embodiment of the present invention, the top barrier is also patterned to further isolate the pixels. This embodiment is shown in FIG. 11. The panel 110 of FIG. 11 consists of a plurality of electrodes (anodes) 111, insulating grid 112, organic stacks 113 and second electrodes (cathodes) 114 between a substrate 115 and a patterned top barrier 116. FIG. 12 shows another variation of the current embodiment in which the anode is continuous (not patterned). The panel 120 of FIG. 12 consists of an electrode (anode) 121, insulating grid 122, organic stacks 123 and second electrodes (cathodes) 124 between a substrate 125 and a patterned top barrier 126. The organic stacks 123, cathodes 124 and top thin film barrier 126 are patterned. The grid 122 disposed over a portion of the anode 121 is a barrier material. This barrier grid provides the required edge seal for Pixels 1, 2 and 3. The organic stack is patterned in such a way that no organic material is deposited directly on top or sidewall of the barrier grid or in other words, the organic material is not continuous over the entire panel. This can be accomplished using vias that connect the cathode to a bus line, or by using a cathode material that is also an excellent barrier, such as metals or certain TCO materials, such as IZO. Thus, in each pixel the top barrier material is in contact with the barrier grid material. The pixels are thus hermetically sealed and isolated.

Figure 13:
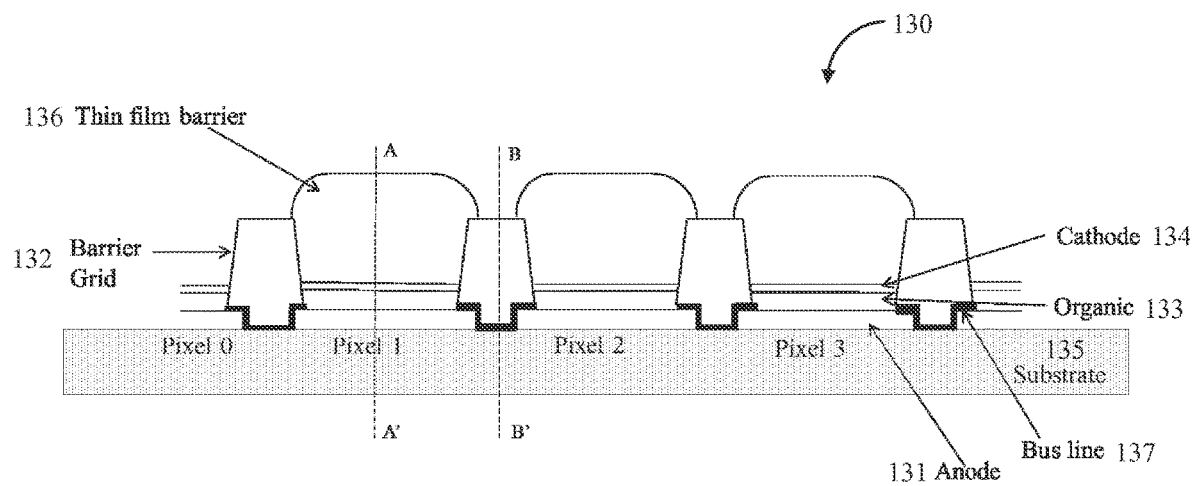
FIG. 13 shows a cross section of a thin film encapsulated. OLED panel on a rigid substrate containing 4 pixels according to an embodiment of the disclosed subject matter. AA' and BB' are the cutting axis. The top thin film barrier is patterned. Metal bus lines are included.

Another variation of the current embodiment is shown in FIG. 13. The panel 130 of FIG. 13 consists of a plurality of electrodes (anodes) 131, insulating grid 132, organic stacks 133 and second electrodes (cathodes) 134 between a substrate 135 and a patterned top barrier 136. The device architecture is similar to FIG. 11, except for the addition of metal bus lines 137 to improve current distribution across the panel. The barrier grid 132 here is disposed over the bus lines 137 to prevent electrical shorting with the cathodes 134.

Figure 14:
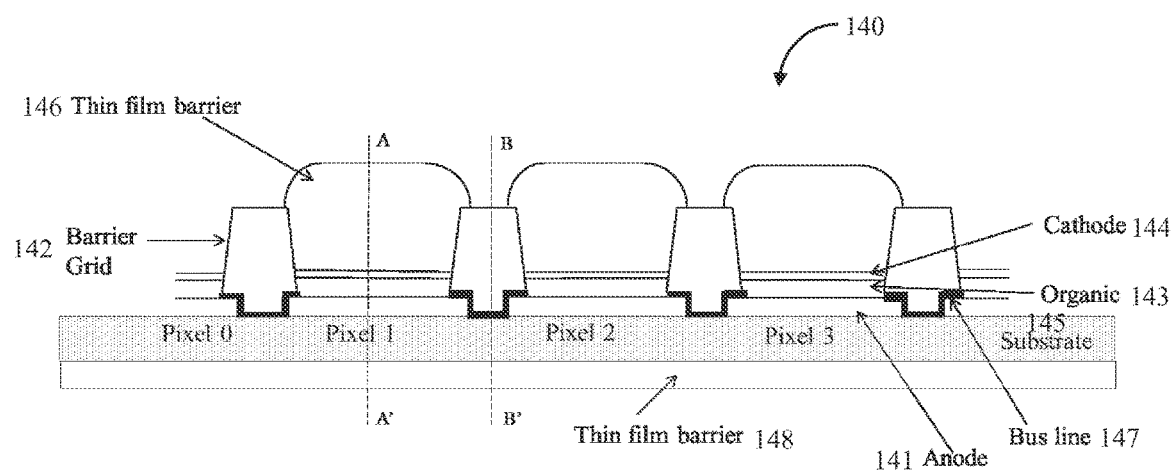
FIG. 14 shows a cross section of a thin film encapsulated OLED panel containing 4 pixels on a flexible polymer substrate such as poly ethylene terephthalate (PET) and poly ethylene naphthalate (PEN) according to an embodiment of the disclosed subject matter. A thin film barrier is disposed on the back side of the substrate. Metal bus lines are included. The top thin film barrier is patterned.
Figure 15:
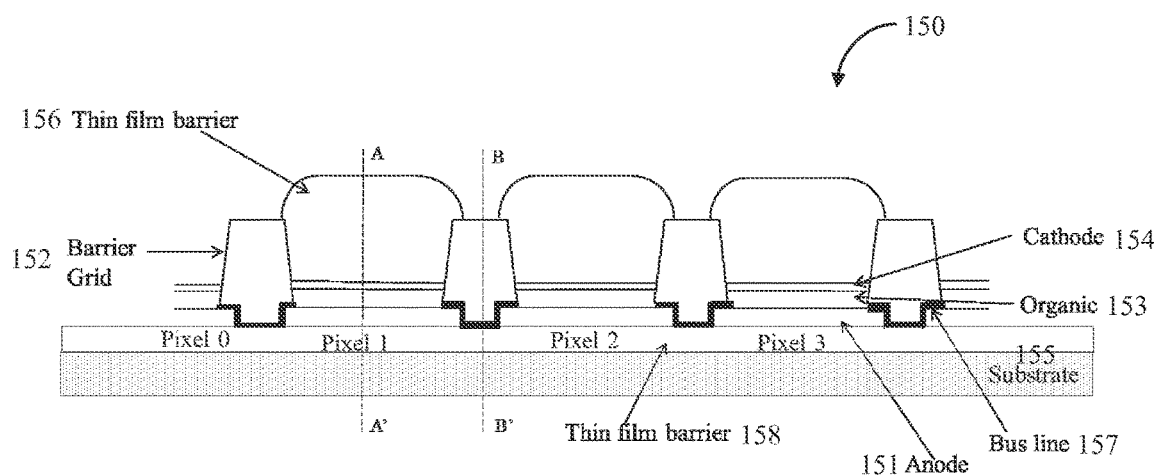
FIG. 15 shows a cross section of a thin film encapsulated OLED panel containing 4 pixels on a flexible polymer substrate such as poly ethylene terephthalate (PET) and poly ethylene naphthalate (PEN) according to an embodiment of the disclosed subject matter. The thin film barrier is disposed on top of the substrate before the anode. Metal bus lines are included.

Additionally for flexible lighting panels fabricated on polymeric substrates such as poly-ethylene terephthalate (PET) and poly ethylene naphthalate (PEN), thin film barriers are required on the substrate side of the panel to protect the device from moisture. Examples are shown in FIGS. 14 and 15. In FIG. 14, a thin film barrier is disposed on the back side of the substrate, while in FIG. 15, the barrier is disposed on top of the substrate before the anode. The panel 140 of FIG. 14 consists of a plurality of electrodes (anodes) 141, insulating grid 142, organic stacks 143 and second electrodes (cathodes) 144 between a substrate 145 and a patterned top barrier 146. A plurality of bus lines 147 are also provided. A thin film barrier 148 is disposed on the back side of the substrate 145. In the architecture shown in FIG. 15, the barrier is disposed on top of the substrate before the anode. The panel 150 of FIG. 15 consists of a plurality of electrodes (anodes) 151, insulating grid 152, organic stacks 153 and second electrodes (cathodes) 154 between a substrate 155 and a patterned top barrier 156. A plurality of bus lines 157 are also provided. A thin film barrier 158 is disposed on top of the substrate 155 before the anodes 151.

If this panel is cut along AA'; i.e.: cutting through top barrier, cathode, organic, anode, substrate, and bottom thin film barrier, Pixel 1 is physically destroyed and does not light up. Further, the cutting process can damage the pixel in other ways: a) by introducing an electrical short; b) delamination of the cathode and the barrier from the organic; and c) delamination/crack propagation when the panel is flexed. Although Pixel 1 is compromised after the cutting process, Pixels 0, 2 and 3 stay intact. The delamination/cracks do not spread to Pixels 0, 2 and 3 as the organic stack is isolated. Further since the grid is made from a barrier material, Pixels 0, 2 and 3 remain hermetically sealed.

If the panel is cut along BB'; i.e.: cutting through, barrier grid, substrate, and bottom thin film barrier (if present), none of the pixels are damaged as this region does not have the weak organic-cathode interface. Additionally, the adhesion strength between the barrier grid and top barrier is very good. Pixels 0, 2 and 3 are functional since the electrical contact is intact. Delamination/cracks do not spread to Pixels 0, 2 and 3 as the organic stack is isolated and remains hermetically sealed.

In all the cases, the lifetime of the panel will be determined by the edge sealing ability of the barrier grid.

Other variations of Embodiments 1 and 2 for a rigid substrate are shown in FIGS. 16-22. Various other combinations including metal bus lines, fuses, and bottom barrier layers are possible for all types of substrates. In all the architectures, the organic stack of the OLED pixel is contained within its own hermetically sealed structure.

Figure 16:
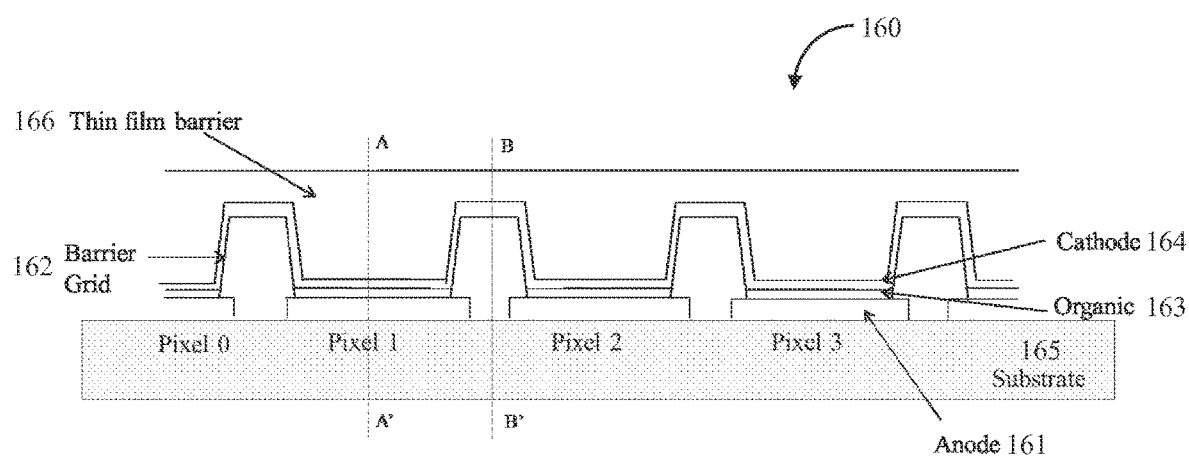
FIG. 16 shows a cross section of a thin film encapsulated OLED panel on a rigid substrate containing 4 pixels according to an embodiment of the disclosed subject matter. AA' and BB' are the cutting axis. The cathode is blanket deposited.
Figure 17:
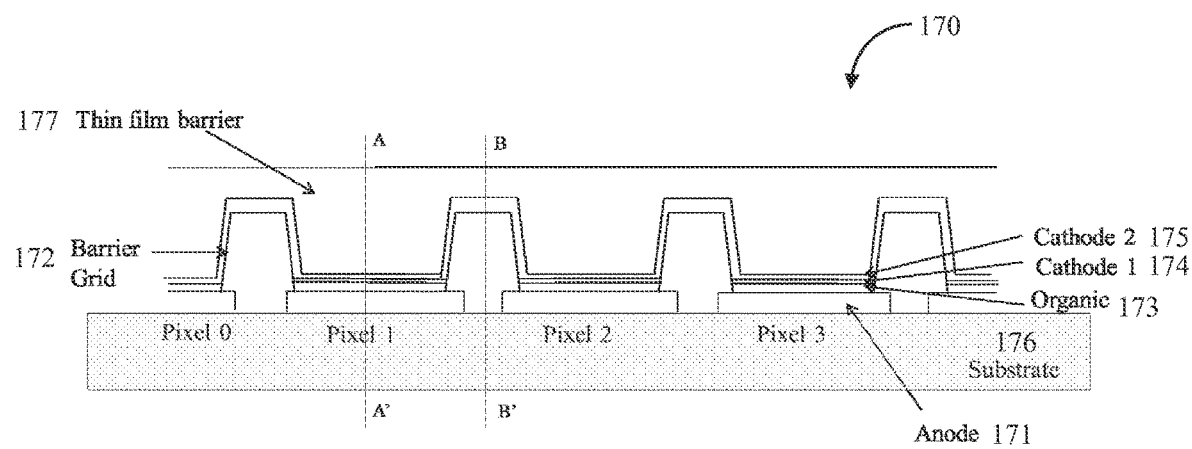
FIG. 17 shows a cross section of a thin film encapsulated OLED panel on a rigid substrate containing 4 pixels according to an embodiment of the disclosed subject matter. AA' and BB' are the cutting axis. Cathode 1 is patterned, while cathode 2 is blanket deposited.

FIG. 16 shows an architecture in which the cathode is continuous (not patterned). The panel 160 of FIG. 16 consists of a plurality of electrodes (anodes) 161, insulating grid 162, organic stacks 163 and a continuous second electrode (cathode) 164 between a substrate 165 and a top barrier 166. The cathode 164 mentioned here may be made of a single layer or multiple layers. Further if the cathode is comprised of multiple layers, the first cathode layer may be patterned while the second cathode layer may be continuous as shown in FIG. 17. The panel 170 of FIG. 17 consists of a plurality of electrodes (anodes) 171, insulating grid 172, organic stacks 173, a patterned second electrode layer (cathode) 174 and a continuous second electrode layer (cathode) 175 between a substrate 176 and a top barrier 177. For example: the bilayer cathode may be Ca/IZO or Mg:Ag/IZO. Ca or Mg can be deposited as the patterned electrode (cathode) 174 in the active region (within the grid boundaries) while the IZO can be deposited as the continuous electrode (cathode) 175. This is advantageous especially after the panel is cut since IZO is less reactive to moisture when compared to reactive low work function reflective/transparent cathodes.

Figure 18:
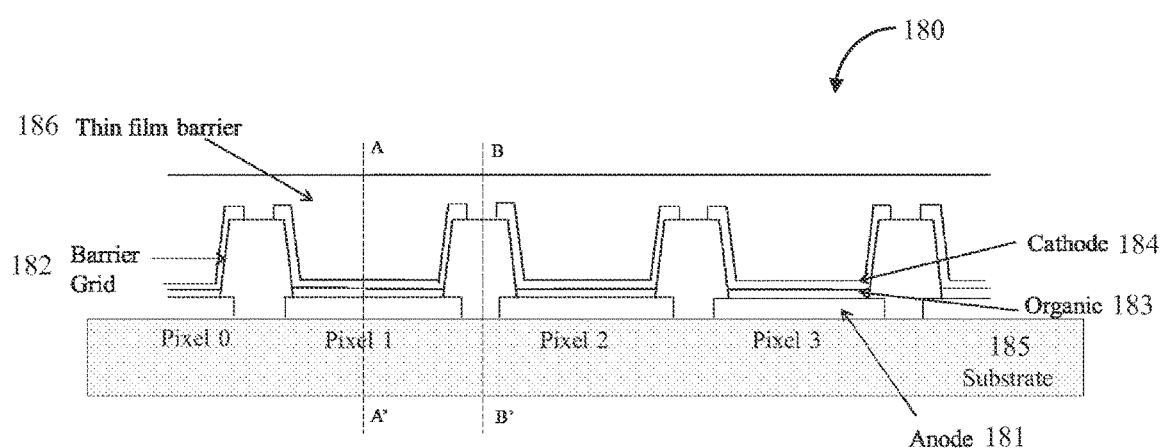
FIG. 18 shows an architecture in which portions of the patterned cathode are deposited on the sidewalls and top of the barrier grid according to an embodiment of the disclosed subject matter.
Figure 19:
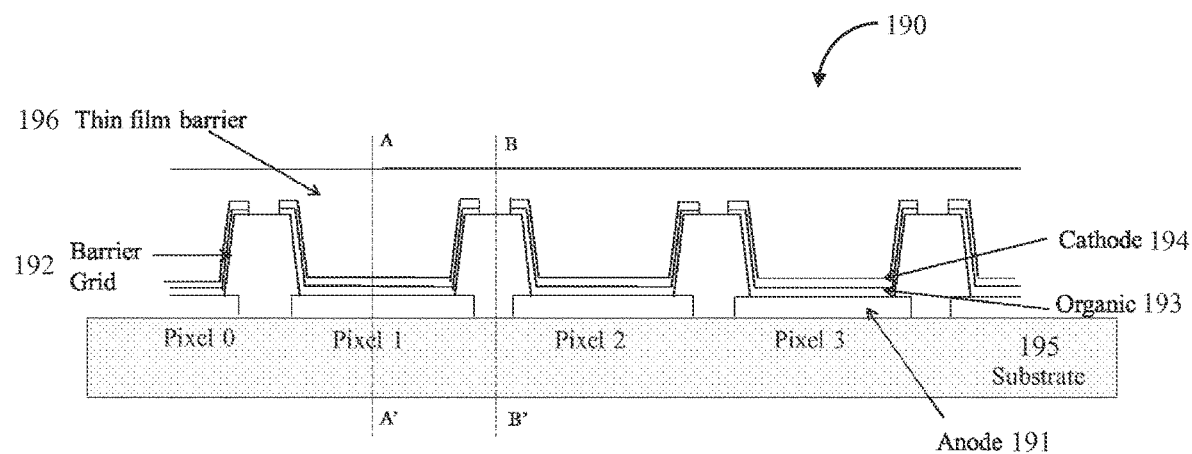
FIG. 19 shows an architecture in which portions of the patterned organic and cathode are deposited on the sidewalk and top of the barrier grid according to an embodiment of the disclosed subject matter.
Figure 20:
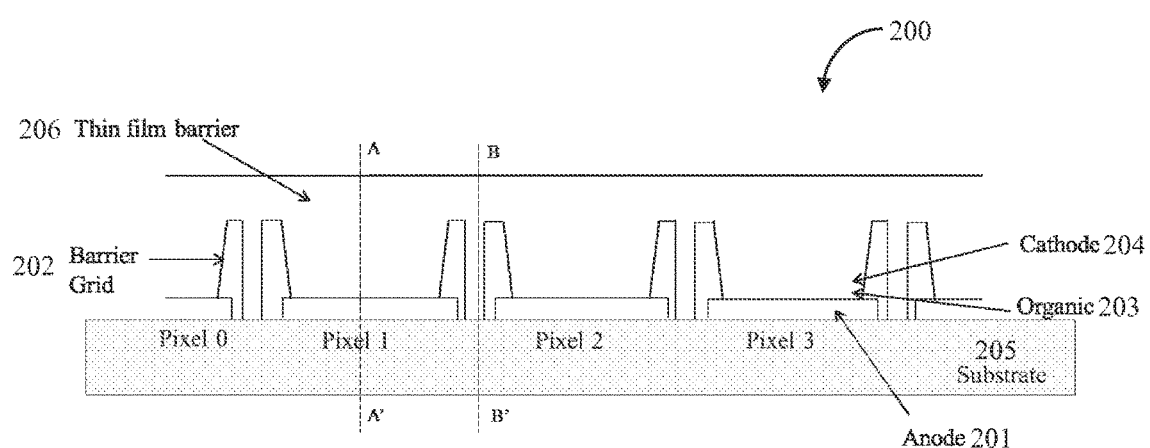
FIG. 20 shows an architecture in which the barrier grid is not continuous; i.e.: adjacent pixels do not share the same barrier grid, according to an embodiment of the disclosed subject matter.
Figure 21:
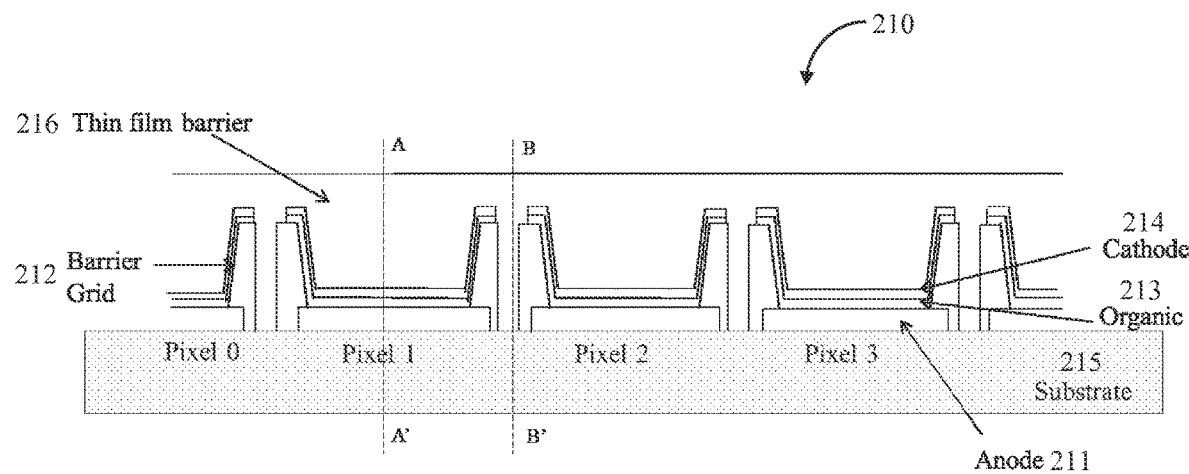
FIG. 21 shows an architecture in which the barrier grid is not continuous; adjacent pixels do not share the same barrier grid and organic and cathode are deposited on the sidewalls and top of the barrier grid, according to an embodiment of the disclosed subject matter.
Figure 22:
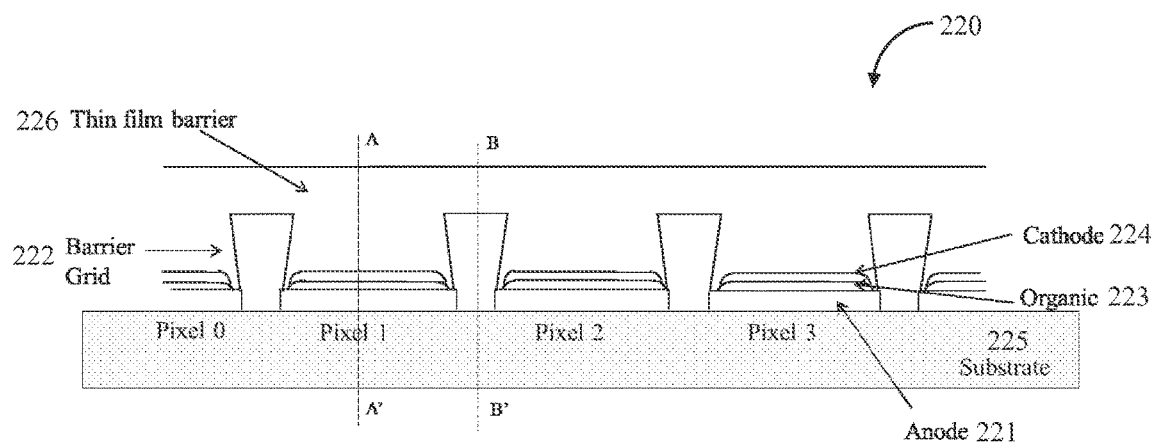
FIG. 22 shows an architecture in which the barrier grid profile is inverted according to an embodiment of the disclosed subject matter. The inverted barrier grid acts a secondary integrated shadow mask for organic stack isolation during deposition.

FIG. 18 shows an architecture in which portions of the patterned cathode are deposited on the sidewalls and top of the barrier grid. The panel 180 of FIG. 18 consists of a plurality of electrodes (anodes) 181, insulating grid 182, organic stacks 183 and a second electrode (cathode) 184 between a substrate 185 and a top barrier 186. Portions of the patterned cathode 184 are deposited on the sidewalls and top of the barrier grid 182. FIG. 19 shows an architecture in which portions of the patterned organic and cathode are deposited on the sidewalls and top of the barrier grid. The panel 190 of FIG. 19 consists of a plurality of electrodes (anodes) 191, insulating grid 192, organic stacks 193 and a second electrode (cathode) 194 between a substrate 195 and a top barrier 196. Portions of both the patterned organic 193 and cathode 194 are deposited on the sidewalls and top of the barrier grid 192. FIG. 20 shows an architecture in which the barrier grid is not continuous; i.e.: adjacent pixels do not share the same barrier grid. The panel 200 of FIG. 20 consists of a plurality of electrodes (anodes) 201, insulating grid 202, organic stacks 203 and a second electrode (cathode) 204 between a substrate 205 and a top barrier 206. The barrier grid 202 is not continuous across Pixels 0, 1, 2 and 3. FIG. 21 shows an architecture in which the barrier grid is not continuous; i.e.: adjacent pixels do not share the same barrier grid and organic and cathode are deposited on the sidewalk and top of the barrier grid. The panel 210 of FIG. 21 consists of a plurality of electrodes (anodes) 211, insulating grid 212, organic stacks 213 and a second electrode (cathode) 214 between a substrate 215 and a top barrier 216. The barrier grid 212 is not continuous across Pixels 0, 1, 2 and 3. Further, portions of both the patterned organic 213 and cathode 214 are deposited on the sidewalk and top of the barrier grid 212. FIG. 22 shows an architecture in which the barrier grid profile is inverted. The panel 220 of FIG. 21 consists of a plurality of electrodes (anodes) 221, insulating grid 222, organic stacks 223 and a second electrode (cathode) 224 between a substrate 225 and a top barrier 226. The inverted barrier grid 222 acts a secondary integrated shadow mask for organic stack 213 and/or cathode 224 isolation during deposition.

Another aspect of the current invention discloses a method for making hermetically sealed OLED pixels shown in the above architectures. The invention particularly teaches a method of making the barrier grid and isolated organic stacks according to some embodiments of the invention.

For rigid substrates, the patterned anode is directly disposed over the substrate. In polymeric substrates, thin film barriers may be disposed on the top and/or bottom sides of the substrate before anode deposition. The barrier grid is then disposed over a portion of the anode. The grid is subsequently patterned during deposition or post-deposition. The organic stack is then deposited and isolated either during deposition or post-deposition. The cathode is deposited to complete the pixel. The entire pixel is then encapsulated with thin film barriers to hermetically seal the OLED pixels.

According to some embodiments of the invention, barrier grids are made by a vacuum deposition. Vacuum deposition may include, but is not limited to sputtering, chemical vapor deposition, evaporation, sublimation, atomic layer deposition (ALD), plasma enhanced chemical vapor deposition (PECVD), plasma assisted atomic layer deposition and combinations thereof. Patterning of the barrier grid to obtain the desired grid profile can be achieved during deposition or post-deposition or a combination of both. During deposition, techniques include but are not limited to the use of a single or plurality of shadow masks to obtain the desired grid profile. Post-deposition patterning techniques include but are not limited to photolithography and wet chemical etching, dry etching or a combination of both. Dry etching processes include non-plasma based etching, plasma based etching and ion beam etching.

Barrier grids can be made from a single material or different materials. For example, if the materials are deposited by sputtering, sputtering targets of different compositions can be used to obtain this layer. Alternatively, two targets of same composition can be used with different reactive gases. Similarly, when the layer is deposited by PECVD, different types of precursors or reactive gasses may be used. Different types of deposition sources could be used. For example, the barrier grid can be made from alternating layers of $SiO_2/SiN_x$. When barrier grid is made from multiple layers, alternate insulating and conductive barrier layers may be used. For example $SiO_xC_yH_z/IZO/SiO_xC_yH_z$ can form a barrier grid.

Barrier grids can be amorphous or polycrystalline. For example, thin films of indium zinc oxide deposited by reactive sputtering from an indium zinc oxide target with oxygen reactive gas are typically amorphous. Thin films of Aluminum oxide deposited by reactive sputtering from an aluminum target with oxygen reactive gas are typically polycrystalline. Nanolaminates consisting of alternate thin stacks of zinc oxide and aluminum oxide can also be used for barrier layers. For example, if the thin films are deposited by atomic layer deposition, alternate thin stacks of $ZnO/Al_2O_3$ may be used.

Barrier grid material can be transparent or opaque depending on the design and application of the device. Inorganic materials such as metal oxides, metal nitrides, metal oxynitrides, metal carbides, metal oxyborides and combinations thereof can be used as a barrier grid material. Metal oxides are preferably selected from silicon oxide, aluminum oxide, tin oxide, zinc oxide, indium tin oxide, indium zinc oxide, aluminum zinc oxide, tantalum oxide, zirconium oxide, niobium oxide, molybdenum oxide and combinations thereof. Metal nitrides are preferably selected from silicon nitride, aluminum nitride, boron nitride and combinations thereof. Metal oxynitrides are preferably selected from aluminum oxynitride, silicon oxynitride, boron oxynitride and combinations thereof. Metal carbides are preferably selected from tungsten carbide, boron carbide, silicon carbide and combinations thereof. Metal oxyborides are preferably zirconium oxyboride, titanium oxyboride and combinations thereof. An alternative is to use a hybrid barrier material such as $SiO_xC_yH_z$. Some organic content may be preferred to ensure that a thick layer can be made without cracking or delamination due to defects or internal stress. This organic content may also improve the flexibility of the film. One such example is the hybrid barrier layer taught in U.S. Pat. No. 7,968,146 B2. This material is a hybrid of inorganic $SiO_2$ and polymeric silicone.

According to some embodiments of the invention, patterning/isolation of the organic stack can be achieved during deposition or post deposition or a combination of both. Patterning during deposition can be by vacuum thermal evaporation (VTE) or organic vapor phase deposition (OVPD) through a shadow mask or other deposition techniques including but not limited to ink jet printing, nozzle printing, organic vapor jet printing (OVJP), thermal jet printing (T-JET) and laser induced thermal imaging (LITI). Alternatively, organic stacks can be isolated post-deposition by plasma etching through shadow masks. Another isolation can be achieved by using inverted barrier grid structures as shown in FIG. 22. In the structure the grids may act as a second mask. Alternatively, organics can be blanket deposited on this structure, and organics on top of the barrier grid can be selectively etched off with plasma etching through shadow masks.

Some embodiments of the disclosed subject matter were experimentally verified by fabricating OLED panels and cutting them. In all the experiments, the barrier grid was a single hybrid barrier layer grown by plasma enhanced chemical vapor deposition (PECVD) of an organic precursor with a reactive gas such as oxygen; e.g.: $HMDSO/O_2$.

Figure 23:
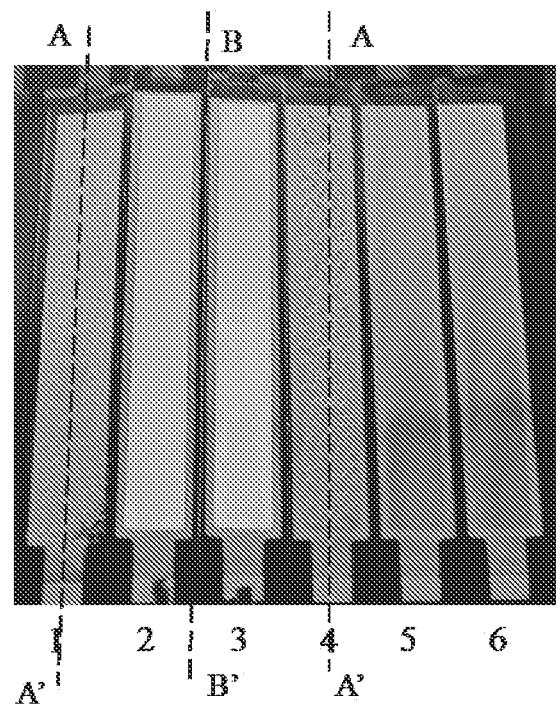
FIG. 23 shows a picture of a thin film encapsulated OLED panel on a glass substrate according to an embodiment of the disclosed subject matter.
Figure 24:
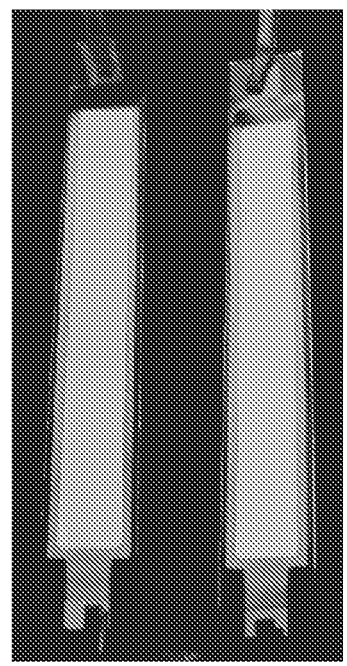
FIG. 24 shows a picture of two hermetically sealed OLED pixels according to an embodiment of the disclosed subject matter.

During a hermetic sealing and cutting test (Encapsulation of OLED), OLED device architecture shown in FIG. 7 was fabricated to test the invention. The devices were grown on glass substrates. Five pre-patterned ITO strips were used as the anode. A 0.5 um thin $SiO_xC_yH_z$ hybrid barrier was blanket deposited on the anode strips. The hybrid barrier layer was grown by plasma enhanced chemical vapor deposition (PECVD) of an organic precursor (HMDSO) with oxygen as the reactive gas. The barrier grid was made by selectively dry etching the barrier using a shadow mask in a reactive ion etch (RIE) tool with $CF_4$ and oxygen plasma. Isolated organic was deposited by VTE using a shadow mask. The cathode was subsequently deposited by VTE using a shadow mask. The devices were then encapsulated with a 2 um thick hybrid thin film barrier. The thin film barrier was blanket deposited. A picture of OLED devices is shown in FIG. 23. The panel was cut along AA' (Pixel 1 and 4), i.e.: cutting through top barrier, cathode, organic, anode, and substrate. As expected, Pixels 1 and 4 were compromised during the cutting process. The barrier and cathode delaminated from the underlying organic stack. Although these two pixels delaminated, the delamination did not spread to other pixels. The panel was then cut along BB'; i.e.: cutting through barrier grid and substrate. Both Pixels 2 and 3 survived the process and no delamination was seen as this region does not have the weak organic-cathode interface. All the pixels that survived the cutting process (Pixels 2, 3, 5, 6) remained hermetically sealed. FIG. 24 is a picture of Pixels 2 and 3 after the cutting process.

Devices fabricated in accordance with embodiments of the invention may be incorporated into a wide variety of consumer products, including flat panel displays, lighting devices, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18° C. to 30° C., and more preferably at room temperature (20° C. to 25° C.), but could be used outside this temperature range, for example, from 40° C. to +80° C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

It is to be appreciated that the Detailed Description section, and not the Summary and Abstract sections, is intended to be used to interpret the claims. The Summary and Abstract sections may set forth one or more but not all illustrative embodiments of the present invention as contemplated by the inventor(s), and thus, are not intended to limit the present invention and the appended claims in any way.

We claim:

1. A method of fabricating an organic light emitting device (OLED) comprising:
   forming a first barrier element over a substrate to provide an insulating grid for an OLED pixel disposed over the substrate;
   forming a plurality of OLED pixels over the substrate, wherein each respective OLED pixel is formed over the substrate within a boundary of the first barrier element, such that the first barrier element surrounds the OLED pixel; and
   forming a second barrier element over the OLED pixel and first barrier element,
   wherein the first barrier element provides an edge seal for each respective OLED pixel, and the second barrier element encapsulates the OLED pixel to provide a top seal;
   wherein the first vapor barrier element is inverted to form a shadow mask for OLED pixel isolation from the first vapor barrier element during formation.

2. The method of claim 1, wherein the first barrier element is formed over the substrate by a vacuum deposition, including one or more of a sputtering, chemical vapor deposition, evaporation, sublimation, atomic layer deposition (ALD), plasma enhanced chemical vapor deposition (PECVD) and plasma assisted atomic layer deposition operation, and combinations thereof.

3. The method of claim 2, wherein patterning of the first barrier element is performed during a period selected from the group consisting of,
   during deposition, using a single or plurality of shadow masks to obtain a desired grid profile,
   during post-deposition, using photolithography, and
   during post-deposition, using one or more of a wet chemical etching and dry etching, wherein dry etching includes non-plasma based etching, plasma based etching and ion beam etching.

4. The method of claim 2, wherein the first barrier element is formed over the substrate by a sputtering deposition and either:
   sputtering targets of different compositions are used; or
   two targets of same composition are used with different reactive gases.

5. The method of claim 2, wherein the first barrier element is formed over the substrate by PECVD using:
   a plurality of types of precursors and/or reactive gasses; and/or
   a plurality of types of deposition sources.

6. The method of claim 1, wherein the first barrier element comprises a barrier material selected from the group consisting of:
   an amorphous or polycrystalline material that includes one or more of: a metal oxide, metal nitride, metal oxynitride, metal carbide and metal oxyboride,
   multiple alternate layers of $SiO_xN_y/SiO_xC_y$ deposited at room temperature by plasma enhanced chemical vapor deposition (PECVD),
   a single hybrid barrier layer deposited by plasma enhanced chemical vapor deposition (PECVD) of an organic precursor with a reactive gas,
   a hybrid material comprising inorganic $SiO_2$ and polymeric silicone deposited at room temperature, and
   a hybrid barrier material comprising $SiO_xC_yH_z$; and
   wherein the substrate is comprised of a flexible polymer material including one or more of a poly carbonate material, a polymeric material, a polyethylene terephthalate (PET) material and a polyethylene naphthalate (PEN) material.

7. The method of claim 1, wherein each respective OLED pixel comprises a stack having a cathode layer, an organic layer and an anode layer,
   wherein each stack is patterned and surrounded by the first barrier element to isolate at least one of the organic layer of the respective OLED pixel from an organic layer of adjacent stacks, the cathode layer of the respective OLED pixel from a cathode layer of adjacent stacks, and the anode layer of the respective OLED pixel from an anode layer of adjacent stacks.

8. The method of claim 7, wherein patterning of the stack is performed during one or more of deposition using vacuum thermal evaporation (VTE), organic vapor phase deposition (OVPD) through a shadow mask, ink jet printing, nozzle printing, organic vapor jet printing (OVJP), thermal jet printing (T-JET) and laser induced thermal imaging (LITI), and post-deposition using plasma etching through shadow masks.

9. The method of claim 7, wherein patterning of the stack is performed using inverted first barrier elements as a mask.

10. The method of claim 1, wherein the device is flexible.

11. The method of claim 1, wherein at least one of the substrate, first barrier element and second barrier element comprise an impact resistant transparent structure.

* * * * *